(12) United States Patent
Waters

(10) Patent No.: US 8,592,255 B1
(45) Date of Patent: Nov. 26, 2013

(54) METHOD FOR ELECTRICALLY CONNECTING DUAL SILICON-ON-INSULATOR DEVICE LAYERS

(75) Inventor: Richard Waters, San Diego, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 78 days.

(21) Appl. No.: 13/442,454

(22) Filed: Apr. 9, 2012

Related U.S. Application Data

(60) Continuation-in-part of application No. 12/840,950, filed on Jul. 21, 2010, which is a continuation-in-part of application No. 11/780,420, filed on Jul. 19, 2007, now Pat. No. 7,767,483, application No. 13/442,454, which is a continuation-in-part of application No. 12/778,898, filed on May 12, 2010, now Pat. No. 8,174,083, which is a division of application No. 11/780,420, filed on Jul. 19, 2007, now Pat. No. 7,767,483.

(51) Int. Cl.
*H01L 23/14* (2006.01)

(52) U.S. Cl.
USPC ..... 438/107; 438/666; 438/928; 257/E21.511

(58) Field of Classification Search
USPC ........................ 438/107, 666, 928, FOR. 369; 257/E21.511
See application file for complete search history.

(56) References Cited

U.S. PATENT DOCUMENTS

| | | |
|---|---|---|
| 7,268,410 B1 * | 9/2007 | Hopper et al. ................. 257/531 |
| 2004/0222358 A1 * | 11/2004 | Bui et al. .................... 250/214.1 |
| 2011/0127527 A1 * | 6/2011 | Kub et al. ......................... 257/43 |

* cited by examiner

*Primary Examiner* — George Fourson, III
(74) *Attorney, Agent, or Firm* — Ryan J. Friedl; Kyle Eppele

(57) ABSTRACT

A method includes providing a handle wafer having first and second sides. A first oxide layer covers the first side, a second oxide layer covers the second side, a first silicon layer covers the first oxide layer, and a second silicon layer covers the second oxide layer. A portion of the first silicon layer and the first oxide layer is etched to create an exposed portion of the first side. A portion of the second silicon layer and the second oxide layer is etched to create an exposed portion of the second side. A first conductive layer is deposited on the exposed portion of the first side such that it contacts the handle wafer, first oxide layer, and first silicon layer. A second conductive layer is deposited on the exposed portion of the second side such that it contacts the handle wafer, second oxide layer, and second silicon layer.

16 Claims, 4 Drawing Sheets

METHOD FOR ELECTRICALLY CONNECTING DUAL SILICON-ON-INSULATOR DEVICE LAYERS

CROSS-REFERENCE TO RELATED APPLICATIONS

This application is a continuation-in-part of U.S. patent application Ser. No. 12/840,950, filed on Jul. 21, 2010, entitled "Method for Fabricating A Dual-Crystalline Silicon Suspension System Using Pre-Fabricated Cavities", which is a continuation-in-part application of U.S. patent application Ser. No. 11/780,420, filed on Jul. 19, 2007, which issued as U.S. Pat. No. 7,767,483 on Aug. 3, 2010, entitled "Dual-Suspension System for MEMS-based Devices and Method for Fabricating Same." This application is also a continuation-in-part of U.S. patent application Ser. No. 12/778,898, filed on May 12, 2010, which issued as U.S. Pat. No. 8,174,083 on May 8, 2012, entitled "Dual Suspension System for MEMS-based Devices, which is a divisional application of U.S. patent application Ser. No. 11/780,420, filed on Jul. 19, 2007, which issued as U.S. Pat. No. 7,767,483 on Aug. 3, 2010, entitled "Dual-Suspension System for MEMS-based Devices and Method for Fabricating Same." The content of all of the above-referenced applications/patents are fully incorporated by reference herein.

FEDERALLY-SPONSORED RESEARCH OR DEVELOPMENT

The Method for Electrically Connecting Dual Silicon-on-Insulator Device Layers was developed with Federal funds and is assigned to the United States Government. Licensing and technical inquiries may be directed to the Office of Patent Counsel, Space and Naval Warfare Systems Center, Pacific, Code 72120, San Diego, Calif., 92152; voice (619) 553-2778; email ssc_pac_T2@navy.mil. Reference Navy Case Number 101648.

BACKGROUND

The embodiments of the disclosed subject matter relate to a method for creating electrical connectivity between two otherwise isolated silicon device layers.

DETAILED DESCRIPTION OF SOME EMBODIMENTS

Figure 1:
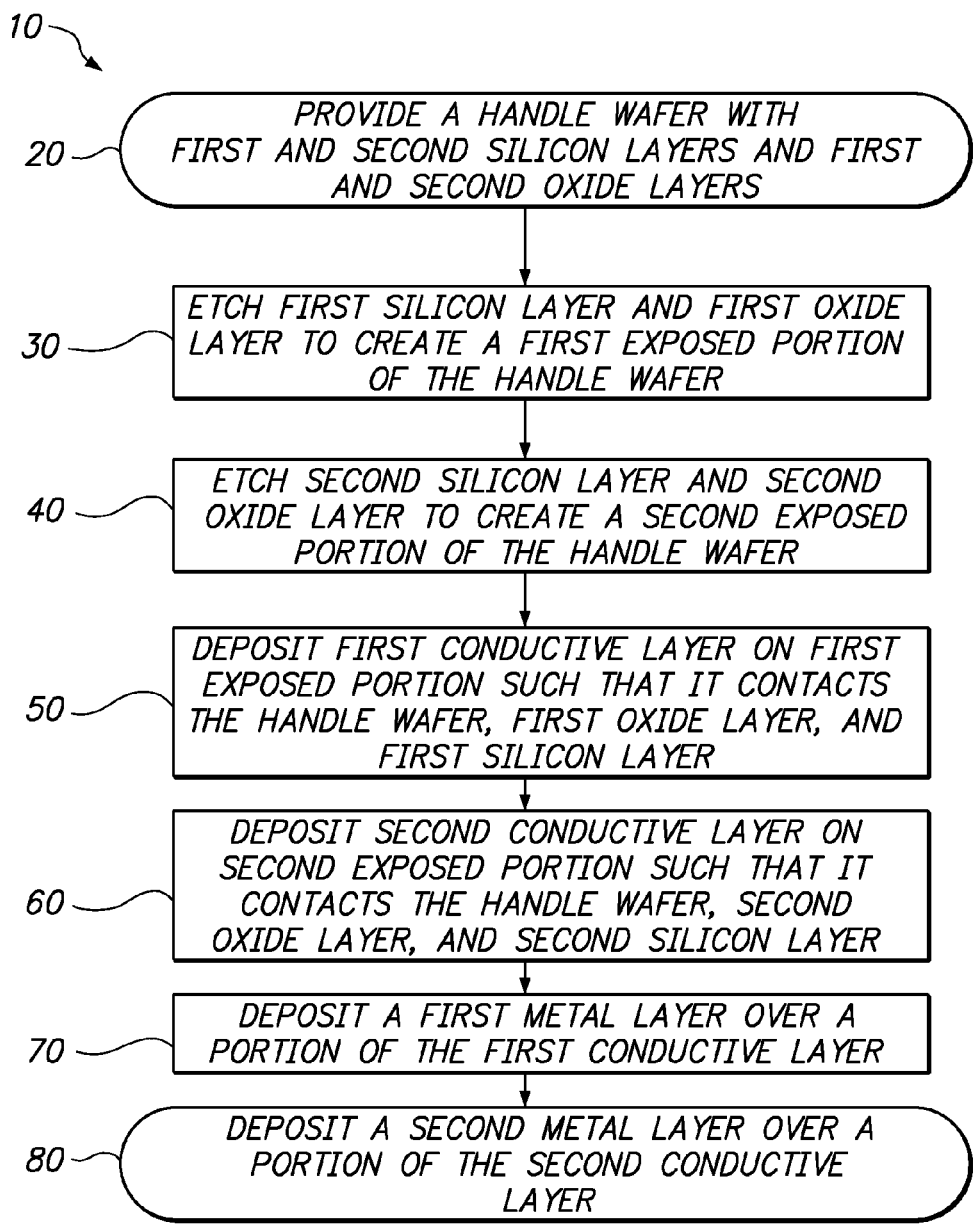
FIG. 1 shows a flowchart of one embodiment of a method for electrically connecting dual silicon-on-insulator device layers.

It is not uncommon for high performance micro electrical-mechanical system (MEMS) sensors to employ silicon-on-insulator (SOI) technology which is comprised of a thick handle wafer, buried oxide (BOX), and device layer silicon. Recent designs, such as those described in U.S. Pat. No. 7,767,483, have included a symmetric SOI design incorporating top and bottom device layer silicon. In these designs, the top and bottom device layer silicon regions are used as both mechanical and electrical layers. The mechanical structure of the composite system is often made to be as symmetric as possible, implying that both top and bottom device silicon layers have the same mechanical structure incorporated into their design.

Symmetric MEMS designs are of great interest because they tend to balance out any inherent stress due to material mismatching. Equally important is the equal (symmetric) distribution of electric potential within the device layers. Due to the presence of the BOX layers insulating each device layer form the central handle wafer, each device layer must be contacted individually and then via the internal package wire bonding or external traces on a PCB are shorted together so that they are at an equivalent voltage level. This creates more wire bonds, increases the risk of ground loops, and leaves the central handle wafer isolated, thus allowing it to charge over time. Charging over time of the central handle wafer can have deleterious effects on the performance of a MEMS sensor.

The embodiments of the method described herein cover a technique to eliminate the wire bonds, eliminate the possibility for ground loops, and allow both device layers to be electrical connected to one another, as well as the central handle wafer. For instance, the entire structure including top and bottom device layer silicon as well as central handle wafer can be set to ground potential, thus reducing any long-term charging effects.

Advanced MEMS structures may employ a dual-crystalline silicon spring structure in an attempt to increase symmetry and decrease temperature dependent strain/stress effects. The dual crystalline silicon structure consists of a central handle wafer of variable thickness (typically 200-500 um) surrounding on either side by a BOX layer and a device layer silicon. The device layer silicon is typically 10's of microns in thickness and should, in most cases, be of the same thickness on either side of the handle wafer.

The device layer silicon on either side of the handle wafer can be used for both defining mechanical structures such as springs as well as making electrical connection for electrostatic actuation. In the later, a parallel plate capacitor can be formed between one of the device silicon layers and an adjacent electrode (either laterally disposed or above the device layer silicon). Application of an electric potential across the parallel plate capacitor creates and electrostatic force that can be used to deflect the mechanical structure.

In certain applications, it is desirable to electrically connect both top and bottom silicon device layers together. However, the BOX disposed between each device layer and the central wafer creates an insulating barrier thus electrically isolating the top and bottom device layers. By making electrical contact, an equal potential can be applied to the entire mechanical structure, thereby once again increasing overall symmetry when an electrostatic potential is applied between the mechanical structure and either the upper or lower electrode. If the potential applied to the mechanical structure were not symmetric then application of a potential to either the lower or upper electrode may result in an uneven displacement of the proof mass or even a tipping/tilting of the structure which would decrease stability and may increase hysteretic affects. To overcome this isolation, electrical connection between top and bottom device layers is established. The embodiments of the method discussed herein allow for the electrical connection between top and bottom silicon device layers.

Figure 2A:
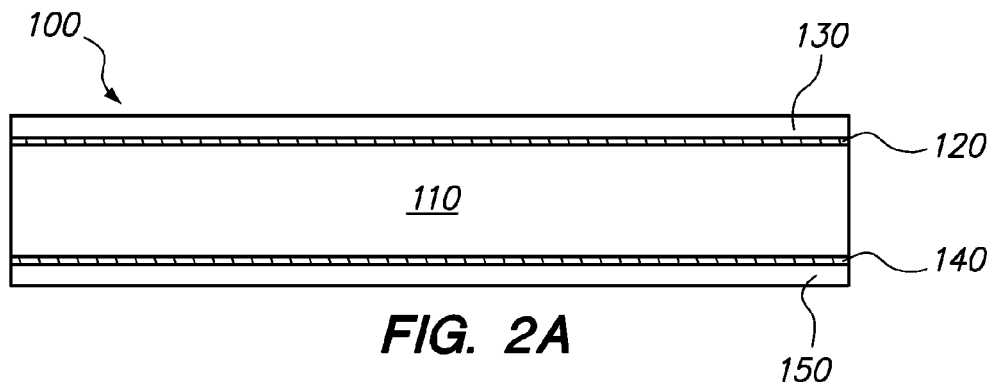
FIGS. 2A-2D show side cross-section views of a substrate undergoing processing according to an embodiment of the method for electrically connecting dual silicon-on-insulator device layers.

FIG. 1 shows a flowchart of one embodiment of a method 10 for electrically connecting dual silicon-on-insulator device layers. For illustrative purposes, and without limitation, method 10 will be discussed with reference to substrates 100 and 200 as shown in FIGS. 2 and 3. Method 10 may begin at step 20, which involves providing a handle wafer 110, as shown in FIG. 2A, having a first side and a second side. A first oxide layer 120 covers the first side and a second oxide layer 140 covers the second side. A first silicon layer 130 covers first oxide layer 120, and a second silicon layer 150 covers second oxide layer 140.

Handle wafer 110 may be of sufficient thickness to ensure rigidity of the overall wafer and desired mechanical properties after processing. As an example, handle wafer 110 may be comprised of (100) Si. The choice of alternate crystallographic orientations may be desired based on desired etch stop planes required to achieve required geometries. First oxide layer 120 and second oxide layer 140 may be of sufficient thickness, for example, to act as etch stops during any subsequent deep silicon etch through handle wafer 110 that may occur to produce a device that incorporates a spring mass system.

First silicon layer 130 and second silicon layer 150 may be of sufficient thickness, for example, to achieve desired mechanical spring constants and resonant frequencies for a spring mass system. Crystallographic orientation of first silicon layer 130 and second silicon layer 150 may typically be (100), but may be altered, for example, to optimize spring characteristics and minimize buckling and potential hysteresis by selecting crystallographic orientations and spring geometries that minimize thermal expansion of first silicon layer 130 and second silicon layer 150 with respect to handle wafer 110.

Figure 2B:
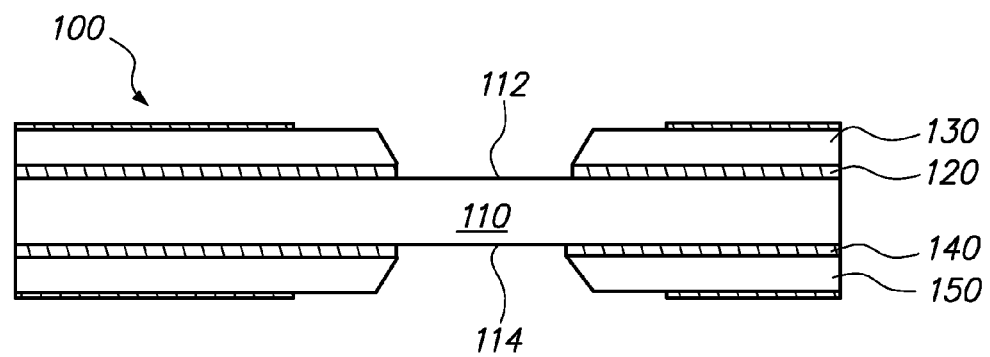

Next, step 30 involves etching through a portion of both first silicon layer 130 and first oxide layer 120 to create an exposed portion 112 of the first side, as shown in FIG. 2B. Step 40 then involves etching through a portion of both second silicon layer 150 and second oxide layer 140 to create an exposed portion of the second side. As an example, the etching of first silicon layer 130 and second silicon layer 150 may be performed by using a wet TMAH/KOW silicon etch or dry silicon etch. Also as an example, the etching of first oxide layer 120 and second oxide layer 140 may be performed by either a wet or dry etch.

Figure 3A:
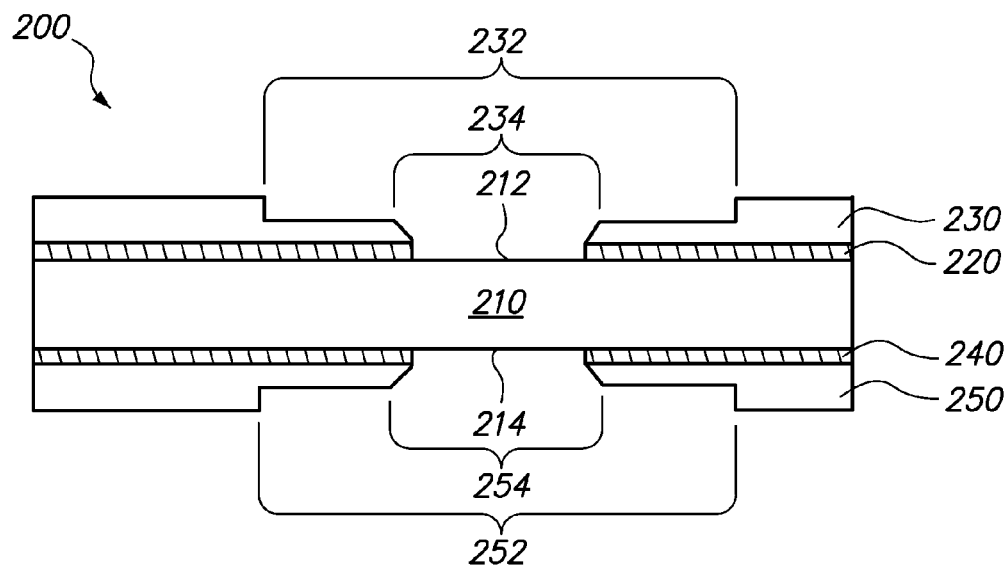
FIGS. 3A and 3B show side cross-section views of a substrate undergoing processing according to an embodiment of the method for electrically connecting dual silicon-on-insulator device layers.
Figure 3B:
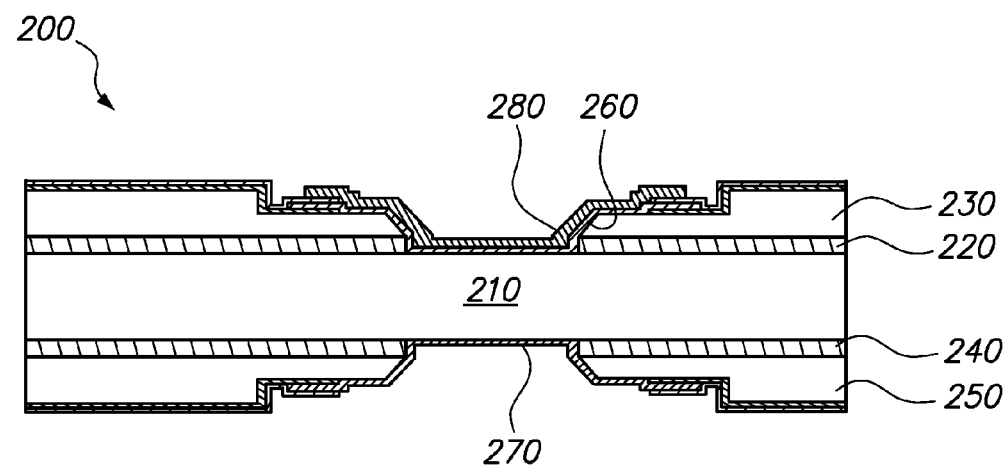

In some embodiments, exposed portion 112 of the first side is aligned opposite exposed portion 114 of the second side, as shown in FIGS. 2B and 3A. In other embodiments, exposed portion 112 of the first side may be offset from exposed portion 114 of the second side. As an example, exposed portion 112 of the first side may be located at one end of handle wafer 110, while exposed portion 114 of the second side is located at the other end of handle wafer 110.

In some embodiments of method 10, step 30 comprises etching a first portion 232, as shown in FIG. 3A, and a second portion 234 in first silicon layer 230, where first portion 232 has a width greater than the width of second portion 234. In such embodiments, the width of the etched portion of first oxide layer 220 is about equal to the width of second portion 234, creating a first exposed portion 212 of handle wafer 210. In embodiments where second portion 234 is angled, the width of the etched portion of first oxide layer 220 is about equal to the narrowest width of second portion 234.

Similarly, in some embodiments, step 40 comprises etching a first portion 252 and a second portion 254 in second silicon layer 250, where second portion 252 has a width greater than the width of second portion 254. In such embodiments, the width of the etched portion of second oxide layer 240 is about equal to the narrowest width of second portion 254, creating a second exposed portion 214 of handle wafer 210. In embodiments where second portion 254 is angled, the width of the etched portion of second oxide layer 240 is about equal to the narrowest width of second portion 254.

In some embodiments, method 10 may include the step of, following steps 30 and 40, performing a buffered oxide etch on first exposed portion 112 and second exposed portion 114 of handle wafer 110 to remove any residual oxides that may exist. Such a step may help prepare handle wafer 110 for the subsequent deposition steps.

Figure 2C:
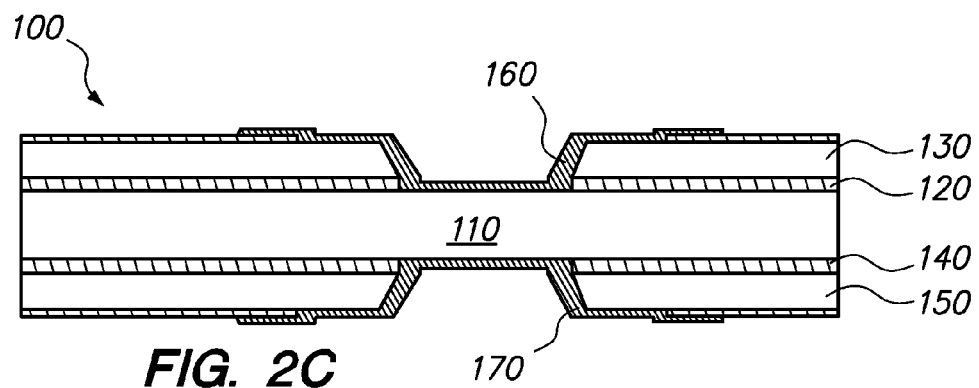

Following step 40, step 50 involves depositing a first conductive layer 160, as shown in FIG. 2C, on exposed portion 112 of the first side such that first conductive layer 160 contacts handle wafer 110, first oxide layer 120, and first silicon layer 130. Method 10 may then proceed to step 60, which involves depositing a second conductive layer 170 on exposed portion 114 of the second side such that second conductive layer 170 contacts handle wafer 110, second oxide layer 140, and second silicon layer 150. In some embodiments, first conductive layer 160 and second conductive layer 170 may each comprise polysilicon. In some embodiments, first conductive layer 160 and second conductive layer 170 may comprise different conductive layers.

In some embodiments, method 10 may include the step of doping first conductive layer 160 and second conductive layer 170 such that the electrical resistance is reduced between first conductive layer 160 and handle wafer 110 and reduced between second conductive layer 170 and handle wafer 110. Such a step helps to increase the conductivity between handle wafer 110, first silicon layer 130, and second silicon layer 150. As an example, first conductive layer 160 and second conductive layer 170 may be doped with boron or phosphorus. In some embodiments, first conductive layer 160 and second conductive layer 170 may be doped in situ during the deposition in steps 50 and 60. In other embodiments, first conductive layer 160 and second conductive layer 170 may be doped after deposition, such as by ion implantation.

Figure 2D:
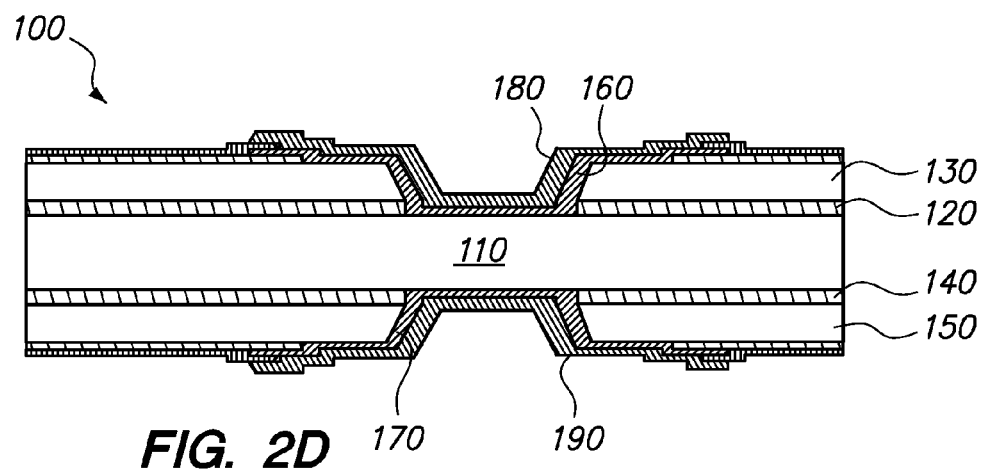

In some embodiments, method 10 may terminate after step 60. In other embodiments, method 10 may proceed to step 70, which involves depositing a first metal layer 180, as shown in FIG. 2D, over at least a portion of first conductive layer 160. Method 10 may then proceed to step 80, which involves depositing a second metal layer 190 over at least a portion of second conductive layer 170. As an example, first metal layer 180 and second metal layer 190 may comprise any suitable material such as Al, Al—Si, Al—Si—Cu, Au—Ti, Au—Cr, Au—Ti—TiW, etc. . . . , to make good Ohmic contact to either the first conductive layer 160 and second conductive layer 170, or directly with handle wafer 110 if first conductive layer 160 and second conductive layer 170 are not used.

In some embodiments, method 10 may further include the step of making electrical contact with at least one of first conductive layer 160 and second conductive layer 170. In embodiments where first metal layer 180 and second metal layer 190 are used, electrical contact may instead be made using first metal layer 180 and second metal layer 190. As an example, electrical contact may be made by wire bonding.

SPECIFIC EXAMPLES

The examples discussed below represent specific processes that incorporate method 10 as described herein.

A first example method includes the following steps: 1) oxidation and/or silicon nitride deposition; 2) patterning and etching the oxide or silicon nitride from step 1; 3) trench etching using DRIE or wet silicon etch (KOH/TMAH/etc.) through approximately ½ the thickness of the device silicon layers (top and bottom device layers); 4) striping oxide (wet or dry etch); 5) oxidation and or silicon nitride deposition; 6) patterning and etching the oxide or silicon nitride from step 5 to create a smaller opening inside of the existing trench; 7) second trench etching again using either DRIE or wet etch of the remaining silicon down to the BOX layers; 8) removal of the BOX exposed during step 7 to expose the central handle wafer silicon; 9) deposition of polysilicon (and selective implantation or in situ doping, if used) to create electrical contact between the silicon device layers and the handle wafer; 10) patterning and etching of the polysilicon; 11) deposition of oxide and/or silicon nitride; 12) patterning and etching oxide over deposited polysilicon region; and 13) depositing and patterning metallization over the polysilicon region to allow for wire bonding to the package so that any arbitrary potential may be applied to the mechanical structure.

A second example method, where recessed metallization is not used, includes the following steps: 1) oxidation and/or silicon nitride deposition; 2) patterning and etching the oxide or silicon nitride from step 1; 3) trench etching using DRIE or wet silicon etch (KOH/TMAH, etc) down to the BOX layers; 4) stripping oxide (wet or dry etch); 5) oxidation and or silicon nitride deposition; 6) patterning and etching the oxide or silicon nitride from step 5, defining contact points between silicon and subsequent polysilicon deposition; 7) deposition of polysilicon (and selective implantation or in situ doping, if used) to create electrical contact between the silicon device layers and the handle wafer; 8) patterning and etching of the polysilicon; 9) deposition of oxide and/or silicon nitride; 10) patterning and etching oxide over deposited polysilicon region; and 11) depositing and patterning metallization over the polysilicon region to allow for wire bonding to the package so that any arbitrary potential may be applied to the mechanical structure.

A third example method, where recessed metallization is not used, includes the following steps: 1) oxidation and/or silicon nitride deposition; 2) patterning and etching the oxide or silicon nitride from step 1; 3) trench etching using DRIE or wet silicon etch (KOH/TMAH, etc) down to the BOX layers; 4) stripping oxide (wet or dry etch); 5) oxidation and or silicon nitride deposition; 6) patterning and etching the oxide or silicon nitride from step 5, defining contact points between silicon and subsequent metal deposition; and 7) depositing and patterning metallization region to allow for wire bonding to the package so that any arbitrary potential may be applied to the mechanical structure.

Many modifications and variations of the Method for Electrically Connecting Dual Silicon-on-Insulator Device Layers are possible in light of the above description. Within the scope of the appended claims, the Method for Electrically Connecting Dual Silicon-on-Insulator Device Layers may be practiced otherwise than as specifically described. Further, the scope of the claims is not limited to the implementations and embodiments disclosed herein, but extends to other implementations and embodiments as may be contemplated by those having ordinary skill in the art.

I claim:

1. A method comprising the steps of:
providing a handle wafer having a first side and a second side, wherein a first oxide layer covers the first side, a second oxide layer covers the second side, a first silicon layer covers the first oxide layer, and a second silicon layer covers the second oxide layer;
etching through a portion of both the first silicon layer and the first oxide layer to create an exposed portion of the first side;
etching through a portion of both the second silicon layer and the second oxide layer to create an exposed portion of the second side;
depositing a first conductive layer on the exposed portion of the first side such that the first conductive layer contacts the handle wafer, the first oxide layer, and the first silicon layer; and
depositing second conductive layer on the exposed portion of the second side such that the second conductive layer contacts the handle wafer, the second oxide layer, and the second silicon layer.

2. The method of claim 1, wherein the exposed portion of the first side is aligned opposite the exposed portion of the second side.

3. The method of claim 1, wherein the first conductive layer and the second conductive layer each comprise polysilicon.

4. The method of claim 1 further comprising the step of doping the first conductive layer and the second conductive layer such that the electrical resistance is reduced between the first conductive layer and the handle wafer and reduced between the second conductive layer and the handle wafer.

5. The method of claim 1 further comprising the steps of:
depositing a first metal layer over at least a portion of the first conductive layer; and
depositing a second metal layer over at least a portion of the second conductive layer.

6. The method of claim 1 further comprising the step of making electrical contact with at least one of the first conductive layer and the second conductive layer.

7. The method of claim 1, wherein the step of etching through a portion of both the first silicon layer and the first oxide layer to create an exposed portion of the first side comprises etching a first portion and a second portion in the first silicon layer, wherein the first portion has a width greater than the width of the second portion.

8. The method of claim 7, wherein the width of the exposed portion of the first side is equal to the width of the second portion of the first silicon layer.

9. The method of claim 7, wherein the step of etching through a portion of both the second silicon layer and the second oxide layer to create an exposed portion of the second side comprises etching a first portion and a second portion in the second silicon layer, wherein the first portion of the second silicon layer has a width greater than the width of the second portion of the second silicon layer.

10. The method of claim 9, wherein the width of the exposed portion of the second side is equal to the width of the second portion of the second silicon layer.

11. A method comprising the steps of:
providing a handle wafer having a first side and a second side, wherein a first oxide layer covers the first side, a second oxide layer covers the second side, a first silicon layer covers the first oxide layer, and a second silicon layer covers the second oxide layer;
etching through a portion of both the first silicon layer and the first oxide layer to create an exposed portion of the first side, wherein a first portion and a second portion is etched in the first silicon layer, wherein the first portion of the first silicon layer has a width greater than the width of the second portion of the first silicon layer;
etching through a portion of both the second silicon layer and the second oxide layer to create an exposed portion of the second side, wherein a first portion and a second portion is etched in the second silicon layer, wherein the first portion of the second silicon layer has a width greater than the width of the second portion of the second silicon layer;

depositing a first conductive layer on the exposed portion of the first side such that the first conductive layer contacts the handle wafer, the first oxide layer, and the first silicon layer;

depositing second conductive layer on the exposed portion of the second side such that the second conductive layer contacts the handle wafer, the second oxide layer, and the second silicon layer;

depositing a first metal layer over at least a portion of the first conductive layer; and depositing a second metal layer over at least a portion of the second conductive layer.

12. The method of claim 11, wherein the width of the exposed portion of the first side is equal to the width of the second portion of the first silicon layer.

13. The method of claim 11, wherein the width of the exposed portion of the second side is equal to the width of the second portion of the second silicon layer.

14. The method of claim 11, wherein the exposed portion of the first side is aligned opposite the exposed portion of the second side.

15. The method of claim 11, wherein the first conductive layer and the second conductive layer each comprise polysilicon.

16. The method of claim 11 further comprising the step of doping the first conductive layer and the second conductive layer such that the electrical resistance is reduced between the first conductive layer and the handle wafer and reduced between the second conductive layer and the handle wafer.

\* \* \* \* \*